(12) United States Patent
Park

(10) Patent No.: US 8,508,992 B2
(45) Date of Patent: Aug. 13, 2013

(54) SEMICONDUCTOR MEMORY DEVICE AND METHOD OF OPERATING THE SAME

(75) Inventor: Seong Je Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 237 days.

(21) Appl. No.: 13/177,603

(22) Filed: Jul. 7, 2011

(65) Prior Publication Data

US 2012/0008402 A1 Jan. 12, 2012

(30) Foreign Application Priority Data

Jul. 9, 2010 (KR) ............. 10-2010-0066523
Jun. 23, 2011 (KR) ............. 10-2011-0061038

(51) Int. Cl.
*G11C 11/34* (2006.01)

(52) U.S. Cl.
USPC ........... 365/185.03; 365/185.18; 365/185.19

(58) Field of Classification Search
USPC ........... 365/185.03, 185.11, 185.25, 185.28, 365/185.16, 185.24, 185.22, 185.18, 185.19
See application file for complete search history.

(56) References Cited

U.S. PATENT DOCUMENTS

| 2008/0049497 A1* | 2/2008 | Mo ............... 365/185.03 |
| 2008/0080237 A1* | 4/2008 | Park ............. 365/185.03 |
| 2008/0080260 A1* | 4/2008 | Seong ........... 365/189.05 |
| 2010/0277979 A1* | 11/2010 | Kang et al. ..... 365/185.03 |

FOREIGN PATENT DOCUMENTS

| KR | 100816161 B1 | 3/2008 |
| KR | 1020100006659 A | 1/2010 |
| KR | 1020100129064 A | 12/2010 |

* cited by examiner

*Primary Examiner* — Alexander Sofocleous
*Assistant Examiner* — Hien Nguyen
(74) *Attorney, Agent, or Firm* — William Park & Associates Patent Ltd.

(57) ABSTRACT

A method of operating a semiconductor memory device includes performing an LSB program operation for selected memory cells while raising a program voltage, when the threshold voltages of some of the selected memory cells reach a target level, storing data, corresponding to a relevant program voltage, in a first flag cell, performing the LSB program operation for some of the selected memory cells, having threshold voltages not reached the target level, until the threshold voltages of all the selected memory cells reach the target level, and after the LSB program operation is completed, performing an MSB program operation for the selected memory cells by using a program voltage, set based on the data stored in the first flag cell, as a start program voltage.

18 Claims, 5 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0066523 filed on Jul. 9, 2010 and Korean patent application number 10-2011-0061038 filed on Jun. 23, 2011, the entire disclosure of which are incorporated by reference herein, are claimed.

BACKGROUND

Exemplary embodiments relate to a method of operating a semiconductor memory device and, more particularly, to a method of programming a nonvolatile memory device.

A nonvolatile memory device includes a memory cell array in which data is stored. The memory cell array includes a plurality of memory cell strings. Each of the memory cell strings includes a drain select transistor, a source select transistor, and a plurality of memory cells coupled in series between the drain select transistor and the source select transistor. The gates of the drain select transistors belonging to different cell strings are coupled to a drain select line, and the gates of the source select transistors belonging to different cell strings are coupled to a source select line. Furthermore, the gates of the memory cells belonging to different cell strings are coupled to respective word lines.

The program operation of the nonvolatile memory device is described below.

FIG. 1 is a diagram illustrating a known program method, and FIG. 2 is a diagram illustrating a shift of the threshold voltages of memory cells according to the program method of FIG. 1.

The program operation of the nonvolatile memory device is performed according to an incremental step pulse program (hereinafter referred to as an 'ISPP') method of supplying a gradually rising program voltage to a selected word line WL. The program operation using the ISPP method includes supplying a program voltage Vpgm to the selected word line, supplying a verification voltage Vf to the selected word line in order to verify whether the threshold voltages of programmed memory cells have reached a target level, and repeating above steps by supplying the program voltage Vpgm increasing until the threshold voltages reach the target level (22).

In the program operation using the ISPP method, a start program voltage first supplied to the selected word line is set to have a relatively low level. At the early stage (12 of FIG. 2) in which the program voltage is supplied, a difference between the target level (Vt of FIG. 2) and the threshold voltages of the memory cells is great. That is, after the start program voltage is supplied, the program voltage is raised several times, and thus the threshold voltages of the memory cells become close to the target level. Accordingly, the time T20 that it takes to perform the program operations is unnecessarily long due to the program operations performed at the early stage.

Furthermore, during the program operations, data of a specific pattern inducing an interference may be programmed into memory cells. For example, memory cells belonging to two or three neighboring strings may be programmed. Accordingly, the data stored in the memory cells may become changed by the program voltage supplied to the neighboring strings.

In order to reduce the interference, a method of programming data by random pattern is recently being used. According to a known art, a host has to allocate data to all columns even if the program operation is performed to only some of the columns. Also, if there is a column to which data has not been allocated, an error may occur.

BRIEF SUMMARY

According to exemplary embodiments, when a program operation using the ISPP method is performed, if the number of memory cells having threshold voltages reached a target level, from among the memory cells of a selected page, reaches a set number, a relevant program voltage is set as the start voltage of a subsequent program operation. Accordingly, the time that it takes to perform program operations can be reduced.

A method of operating a semiconductor memory device according to an aspect of the present disclosure includes performing an LSB program operation for selected memory cells while raising a program voltage, when the threshold voltages of some of the selected memory cells reach a target level, storing data, corresponding to a relevant program voltage, in a first flag cell, performing the LSB program operation for some of the selected memory cells, having threshold voltages not reached the target level, until the threshold voltages of all the selected memory cells reach the target level, and after the LSB program operation is completed, performing an MSB program operation for the selected memory cells by using a program voltage, set based on the data stored in the first flag cell, as a start program voltage.

Performing the LSB program operation for the selected memory cells includes supplying a program voltage to a word line coupled to the selected memory cells and performing the LSB program operation while gradually raising the program voltage until the threshold voltage of any one of the selected memory cells reaches a target level.

Storing the data, corresponding to the relevant program voltage, in the first flag cell includes storing data corresponding to a program voltage when the number of memory cells having threshold voltages reached the target level reach a set number.

The set number is set to 1 or less than 5% of the selected memory cells.

The first flag cell is programmed using an LSB program operation and an MSB program operation.

The MSB program operation is performed by using the start program voltage set based on the data stored in the first flag cell or by using another start program voltage set to be 0.2 V to 0.5 V lower than the start program voltage set based on the data stored in the first flag cell.

Before performing the LSB program operation for the selected memory cells while raising the program voltage, the method further includes inputting program data for the selected memory cells to page buffers, corresponding to the selected memory cells, and making a determination of whether the number of bits to be programmed is less than a set number of bits for each of the page buffers, if, as a result of the determination, the number of bits to be programmed is determined to be equal to or greater than the set number of bits, setting voltages of bit lines, corresponding to the respective page buffers, based on the program data, and if, as a result of the determination, the number of bits to be programmed is determined to be less than the set number of bits, inverting the program data stored in the page buffers and setting the voltages of the bit lines based on the inverted program data.

After inverting the program data stored in the page buffers, information about the inverted program data is stored in a second flag cell of a selected page.

The method further includes setting a program voltage to be used in a subsequent program operation based on the information stored in the second flag cell.

A read operation is performed based on the information stored in the second flag cell.

The method further includes making a determination of whether the LSB and MSB program operations for all pages to be programmed have been completed, after completing the MSB program operation for a page including the selected memory cells.

The method further includes selecting a next page, if, as a result of the determination, the LSB and MSB program operations for all the pages to be programmed are determined not to have been completed, and setting a start program voltage for the MSB program operation by performing the LSB program operation for the selected next page.

A method of operating a semiconductor memory device according to another aspect of this disclosure includes performing an LSB program operation for an even page of a first page, wherein first data, corresponding to a program voltage when the threshold voltages of some of memory cells of the even page reach a target level, is stored in a flag cell, when the threshold voltages of all the memory cells of the even page reach the target level, performing the remaining program operations for the first page using a start program voltage set based on the first data, after all the program operations for the first page are completed, selecting a second page, performing an LSB program operation for an even page of the second page, wherein second data, corresponding to a program voltage when the threshold voltages of some of memory cells of the even page reach a target level, is stored in the flag cell, and when the threshold voltages of all the memory cells of the even page of the second page reach the target level, performing remaining program operations for the second page using a start program voltage set based on the second data.

Performing the remaining program operations for the first page includes performing an MSB program operation for the even page of the first page using the start program voltage set based on the first data, after the MSB program operation for the even page is completed, performing an LSB program operation for an odd page of the first page using the set start program voltage, and after the LSB program operation for the odd page is completed, performing the MSB program operation for the odd page using the set start program voltage.

Performing the LSB program operations for the even page of the first page includes inputting program data for the memory cells, included in the even page of the first page, to page buffers corresponding to the memory cells and making a determination of whether the number of bits to be programmed is less than a set number of bits for each page buffer, if, as a result of the determination, the number of bits to be programmed is determined to be equal to or greater than the set number of bits, setting voltages of bit lines, corresponding to the respective page buffers, based on the program data, and if, as a result of the determination, the number of bits to be programmed is determined to be less than the set number of bits, inverting the program data stored in the page buffers and setting the voltages of the bit lines based on the inverted program data.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
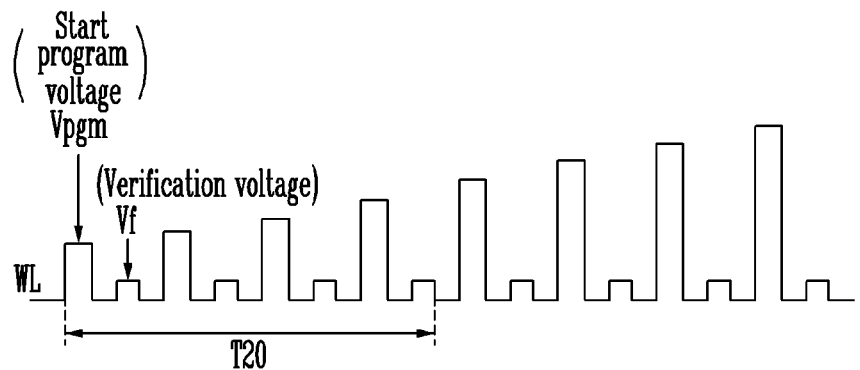
FIG. 1 is a diagram illustrating a known program method.
Figure 2:
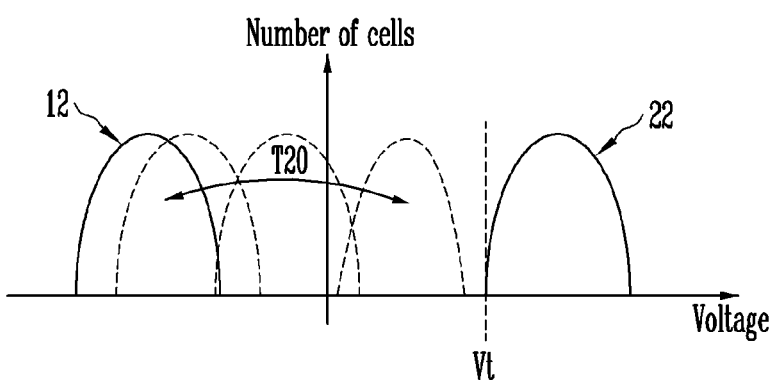
FIG. 2 is a diagram illustrating a shift of the threshold voltages of memory cells according to the program method of FIG. 1.
Figure 3:
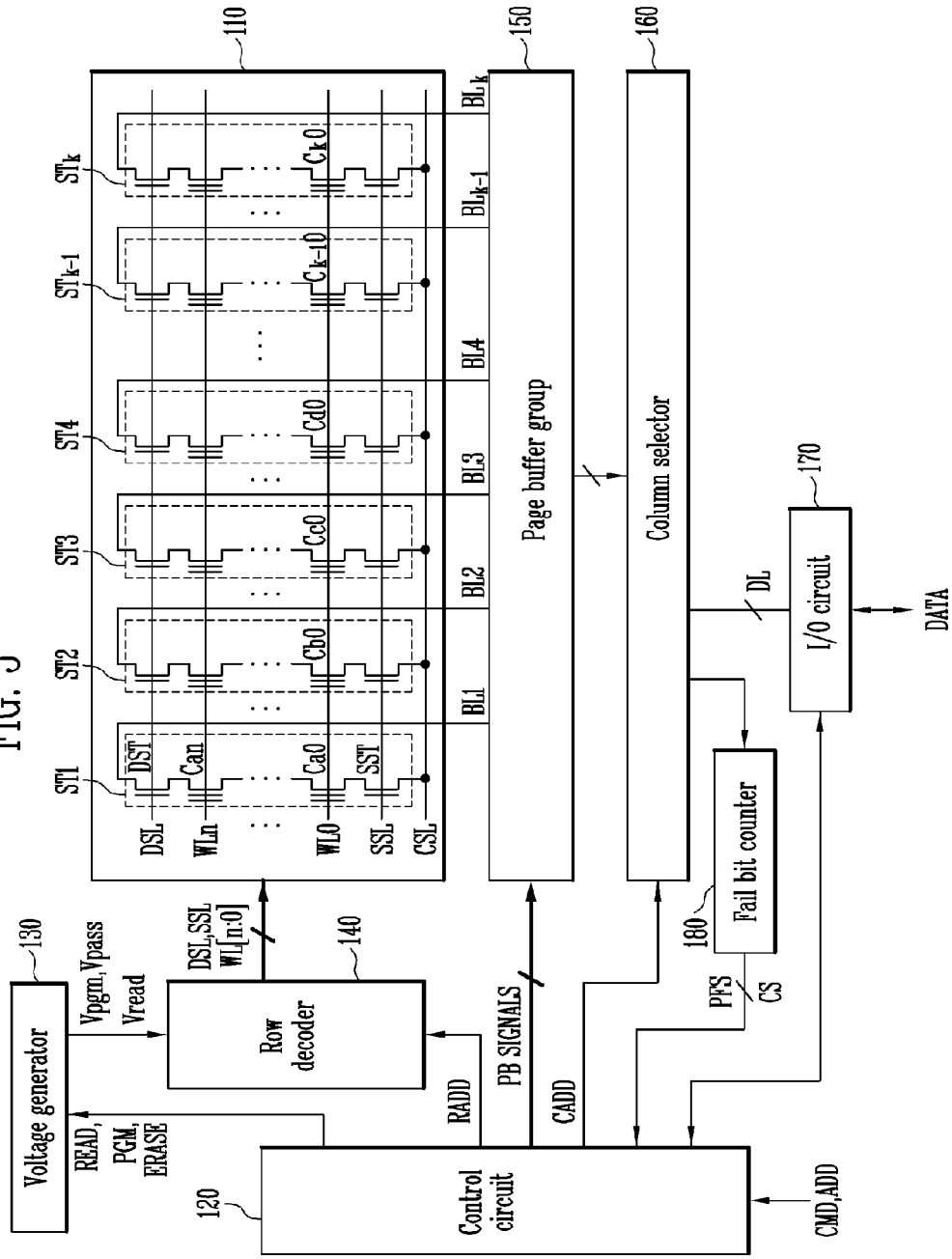
FIG. 3 is a block diagram of a semiconductor memory device for performing a program operation according to this disclosure.

FIG. 3 is a block diagram of a semiconductor memory device for performing a program operation according to an exemplary embodiment of this disclosure.

Referring to FIG. 3, the semiconductor memory device according to the exemplary embodiment of this disclosure includes a memory cell array 110, an operation circuit group (130, 140, 150, 160, 170, and 180) configured to perform a program operation or a read operation for the memory cells of the memory cell array 110, and a control circuit 120 configured to control the operation circuit group (130, 140, 150, 160, 170, and 180).

In the case of a NAND flash memory device, the operation circuit group may include a voltage generator 130, a row decoder 140, a page buffer group 150, a column selector 160, an I/O circuit 170, and a fail bit counter 180.

The memory cell array 110 includes a plurality of memory cell blocks. FIG. 3 shows one of the memory cell blocks. The memory cell block includes a plurality of strings ST1 to STk. According to an example, some of the strings ST1 to STk are designated as normal strings which include memory cells used for recording data, and some of the strings ST1 to STk are designated as flag strings which include memory cells used for recording status information of the memory cells used for recording data. The strings have the same construction. Each of the strings, e.g., a first string ST1 includes a source select transistor SST coupled to a common source line CSL, a plurality of memory cells Ca0 to Can, and a drain select transistor DST coupled to a bit line BL1. The memory cell included in the flag string is called a flag cell, but it has the same construction as the normal memory cell included in the normal string. The gate of the source select transistor SST is coupled to a source select line SSL. The gates of the memory cells Ca0 to Can are coupled to respective word lines WL0 to WLn. The gate of the drain select transistor DST is coupled to a drain select line DSL. The strings ST1 to STk are coupled to the respective bit lines BL1 to BLk and are coupled to the common source line CSL in common.

The control circuit 120 generates a program operation signal PGM, a read operation signal READ, or an erase operation signal ERASE in response to a command signal CMD, and also generates control signals PB SIGNALS for controlling the page buffers (not shown) of the page buffer group 150 according to the types of operations. Furthermore, the control circuit 120 internally generates a row address signal RADD and a column address signal CADD in response to an address signal ADD. Furthermore, the control circuit 120 checks whether the threshold voltages of selected memory cells have risen to at least a target voltage, based on a pass/fail signal PFS generated by the fail bit counter 180 in a program verification operation, and determines whether to perform a program operation again or to terminate the program operation according to a result of the check. In particular, when a program operation is performed, the control circuit 120 receives a count result CS from the fail bit counter 180, compares a set number and the number of program data according to the count result CS, determines whether to invert or maintain data stored in the page buffer group 150 according to the result of the comparison, and outputs the page buffer signals PB SIGNALS according to the result of the determination.

A voltage supply circuit supplies the drain select line DSL, the word lines WL0 to WLn, and the source select line SSL of a selected memory block with operating voltages for the program operation, the erase operation, and the read operation of memory cells in response to the operation signals READ, PGM and ERASE and row address signal RADD generated by the control circuit 120. The voltage supply circuit includes the voltage generator 130 and the row decoder 140.

The voltage generator 130 outputs operating voltages for programming, reading, or erasing selected memory cells to global lines in response to the operation signals PGM, READ, and ERASE (that is, the internal command signals of the control circuit 120) and outputs operating voltages Vpgm, Vpass, and Vread, e.g., program voltage Vpgm to the global lines when selected memory cells are programmed.

The row decoder 140 transfers the operating voltages of the voltage generator 130 to the strings ST1 to STk of a selected memory block of the memory cell array 110 in response to the row address signals RADD of the control circuit 120. That is, the operating voltages are supplied to the local lines DSL, WL[n:0], and SSL of the selected memory block.

The page buffer group 150 includes the page buffers (not shown) coupled to the respective bit lines BL1 to BLk. The page buffer group 150 supplies the bit lines BL1 to BLk with respective voltages necessary to store data in the memory cells Ca0 to Ck0 in response to the control signals PB SIGNALS of the control circuit 120. More particularly, when a program operation, an erase operation, or a read operation for the memory cells Ca0 to Ck0 is performed, the page buffer group 150 precharges the bit lines BL1 to BLk or latches data corresponding to threshold voltage levels of the memory cells Ca0 to Ck0 which are detected according to a shift in the voltages of the bit lines BL1 to BLk. That is, the page buffer group 150 controls voltages of the bit lines BL1 to BLk based on data stored in the memory cells Ca0 to Ck0 and detects data stored in the memory cells Ca0 to Ck0.

The column selector 160 selects the page buffers of the page buffer group 150 in response to the column address signal CADD of the control circuit 120 and outputs data latched in the selected page buffers.

The I/O circuit 170 transfers data, externally inputted during a program operation, to the column selector 160 under the control of the control circuit 120 so that the data is inputted to the page buffer group 150. When the data outputted by the column selector 160 is sequentially inputted to the page buffers of the page buffer group 150, the page buffers store the received data in their internal latches. Furthermore, when a read operation is performed, the I/O circuit 170 externally outputs the data received from the page buffers of the page buffer group 150 via the column selector 160.

The fail bit counter 180 checks whether a cell having a threshold voltage lower than a target voltage exists in programmed memory cells in a program verification operation performed after a program operation and outputs a result of the check as a pass/fail signal PFS. Furthermore, the fail bit counter 180 may count the number of errored cells and output a result of the count as the pass/fail signal PFS. In particular, the fail bit counter 180 counts the number of '0' data in the data received from the column selector 160 during a program operation and transfers the count result CS, generated according to the result of the count, to the control circuit 120.

The control circuit 120 controls a level of a program voltage supplied to a selected word line when a program operation for relevant memory cells is performed and controls the voltage generator 130 so that verification voltages supplied to the selected word line can be selectively supplied in a program verification operation. Alternatively, the control circuit 120 may control the voltage generator 130 in response to the pass/fail signal PFS of the fail bit counter 180.

Figure 4:
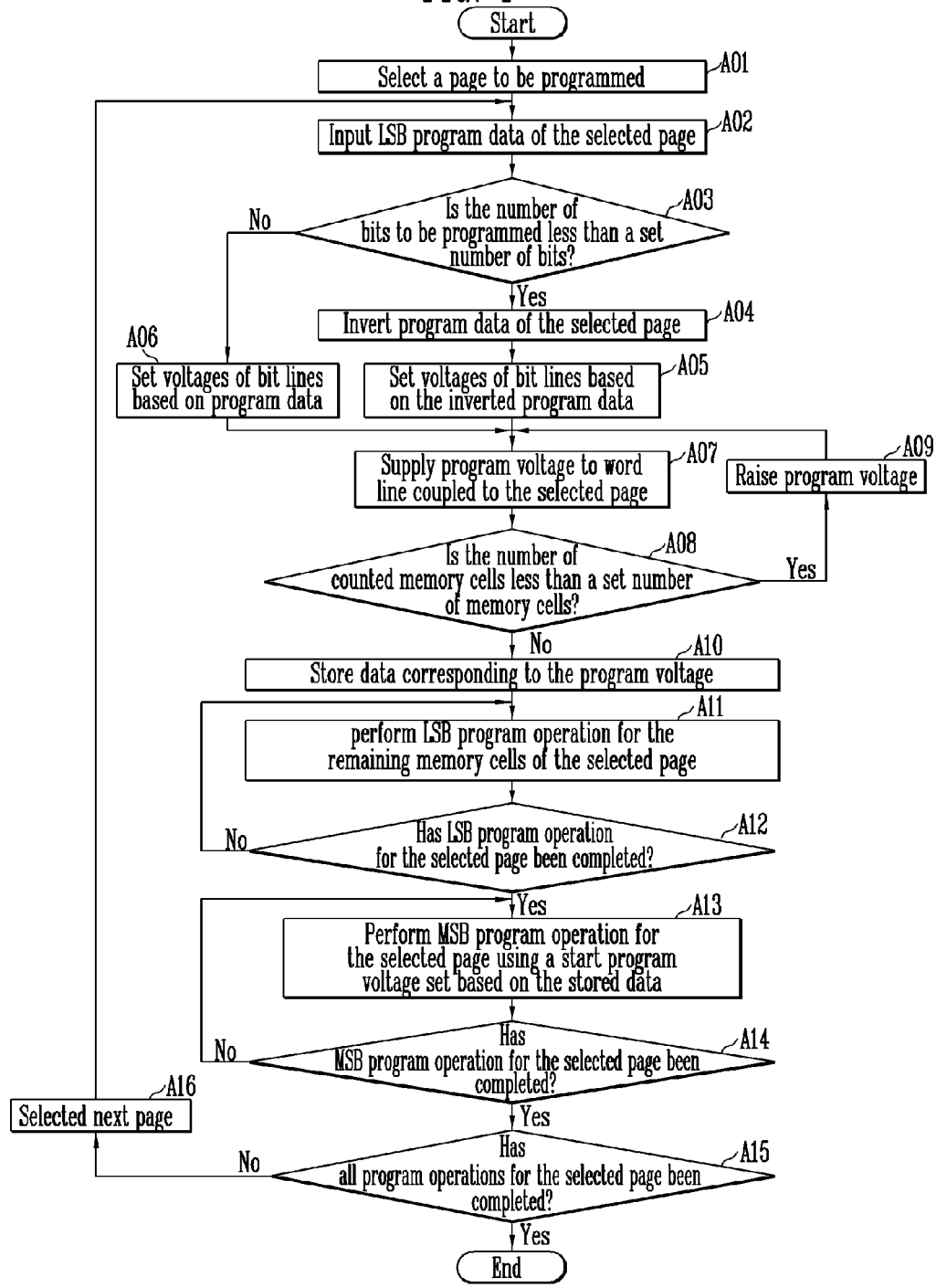
FIG. 4 is a flowchart illustrating a program method using the semiconductor memory device of FIG. 3.

FIG. 4 is a flowchart illustrating a program method using the semiconductor memory device of FIG. 3.

When a program operation starts, a page to be programmed is selected at step A01. Least significant bit (hereinafter referred to as an 'LSB') program data of the selected page is inputted to corresponding page buffers at step A02. It is then determined whether a number of bits to be programmed is smaller than a set number of bits, based on the program data inputted to the page buffers at step A03. For example, it is determined whether a number of "0" bit of an input data is smaller than a set number of bits. Here, the set number of bits is set to ½ or higher, e.g., 50% to 60% of a total number of bits of the selected page. This is because the number of bits for determining a program start voltage must be representative. For example, assuming that the total number of bits of the selected page is 100 and the number of bits to be programmed is 2, the number of bits to be programmed cannot represent the total number of bits. In other words, if a number of "0" in an input data for a program operation is 2 and a total number of bits of the input data is 100, only two cells are programmed, and thus programming characteristics of the two cells cannot represent programming characteristics of the one hundred cells.

If, as a result of the determination at step A03, the number of bits to be programmed, e.g., the number of "0" bit is determined to be equal to or greater than the set number of bits, voltages of bit lines coupled to the respective page buffers are set based on the program data inputted to the page buffers at step A06. For example, when the program data is '0', the bit lines are discharged. When the program data is '1', the bit lines are precharged to a program-inhibition voltage (that is, a power source voltage).

If, as a result of the determination at step A03, the number of bits to be programmed, e.g., the number of "0" bit is determined to be smaller than the set number of bits, the program data of the selected page is inverted at step A04. More particularly, the program data inputted to the page buffers are inverted. That is, if data '0' has been inputted, the page butter latches a value corresponding to data '1'.

In particular, when program data is inverted, relevant information is stored in a register or a memory cell, e.g., in the flag cell of a selected page, and the selected page is read based on the data stored in the flag cell when a read operation is performed. The flag cell may be programmed by performing an LSB program operation and an MSB program operation. Voltages of the bit lines are set based on the inverted program data at step A05.

An LSB program operation is performed by supplying a program voltage to a word line coupled to the selected page at step A07. The program operation is performed according to the ISPP method of gradually raising the program voltage supplied to the word line. Accordingly, when the program operation is first performed at step A07, a start program voltage is supplied to the word line. Here, the start program voltage may be a preset start program voltage.

The number of memory cells having threshold voltages reached the target level is counted, and it is then determined whether the number of counted memory cells is smaller than a set number of memory cells at step A08. Here, the set number of memory cells may be differently set according to a memory device. For example, the set number of memory cells may be set to 5% or less of the total number of the memory cells of a selected page. Also, the set number of memory cells may be set to "1". If, as a result of the determination at step A08, the number of counted memory cells is determined to be smaller than the set number of memory cells, the program voltage is raised at step A09. The program operation (A07) is performed by supplying the raised program voltage to the selected word line, thereby raising the threshold voltages of the memory cells of the selected page.

If, as a result of the determination at step A08, the number of counted memory cells is determined to be equal to or greater than the set number of memory cells, data corresponding to the program voltage is stored in a register or a memory cell, e.g., in a flag cell at step A10. Here, the flag cell may be different from the flag cell in which inverted information about the program data is stored. That is, the data corresponding to the raised program voltage, which is supplied when the number of counted memory cells becomes equal to or greater than the set number of memory cells, is stored as a start program voltage data, for example, in the flag cell of the selected page. Here, the flag cell may be programmed in various levels by assigning each start program voltage data to each threshold voltage level of the flag cell. The start program voltage data is used to set a start program voltage in a subsequent program operation. For example, after the start program voltage data is stored in the flag cell, the start program voltage of a subsequent MSB program operation is set based on the start program voltage data.

An LSB program operation for the remaining memory cells of the selected page is performed at step A11. It is then determined whether the LSB program operation for the selected page has been completed at step A12. If, as a result of the determination, the LSB program operation for the selected page is determined not to have been completed, the LSB program operation for the remaining memory cells is performed by gradually raising the program voltage at step A11.

If, as a result of the determination at step A12, the LSB program operation for the selected page is determined to have been completed, an MSB program operation for the selected page is performed. The MSB program operation is performed using the start program voltage set based on the start program voltage data stored in the flag cell of the selected page at step A13. Here, the set start program voltage may be understood as a program voltage when the threshold voltages of a majority of the memory cells of the selected page start reaching the target level. Accordingly, the threshold voltages of the memory cells may reach the target level within a relatively short period when the MSB program operation for the selected page is performed. Furthermore, a level of the set start program voltage may be slightly lowered by giving an offset. That is, if a start program voltage having a too high level is supplied to memory cells to be programmed, the threshold voltage of the memory cells may shift out of the range of the target voltage even by one program pulse. For this reason, the start program voltage may be set to be 0.2V to 0.5V lower than the start program voltage corresponding to the start program voltage data.

It is determined whether the MSB program for the selected page has been completed at step A14. If, as a result of the determination, the MSB program operation for the selected page is determined not to have been completed, the MSB program operation is repeatedly performed while gradually raising the program voltage. If, as a result of the determination, the MSB program operation for the selected page is determined to have been completed, it is determined whether program operations of all the pages to be programmed has been completed at step A15.

If, as a result of the determination at step A15, the program operations of all the pages to be programmed are determined not to have been completed, a next page is selected and programmed until the program operation for all the pages is completed at step A16, and the above LSB program operation and the above MSB program operation are then performed for the selected page. While the program operation of all the pages is performed, the start program voltages of the respective pages are set. That is, since programming speed of each page may be different, the start program voltage is set for each page. Accordingly, the entire time that it takes to perform the program operations may be reduced by performing the program operations using the set start program voltages.

Furthermore, a page may be divided into an even page and an odd page, and a program operation for each of the even and odd pages may be performed. This is described in more detail below.

Figure 5:
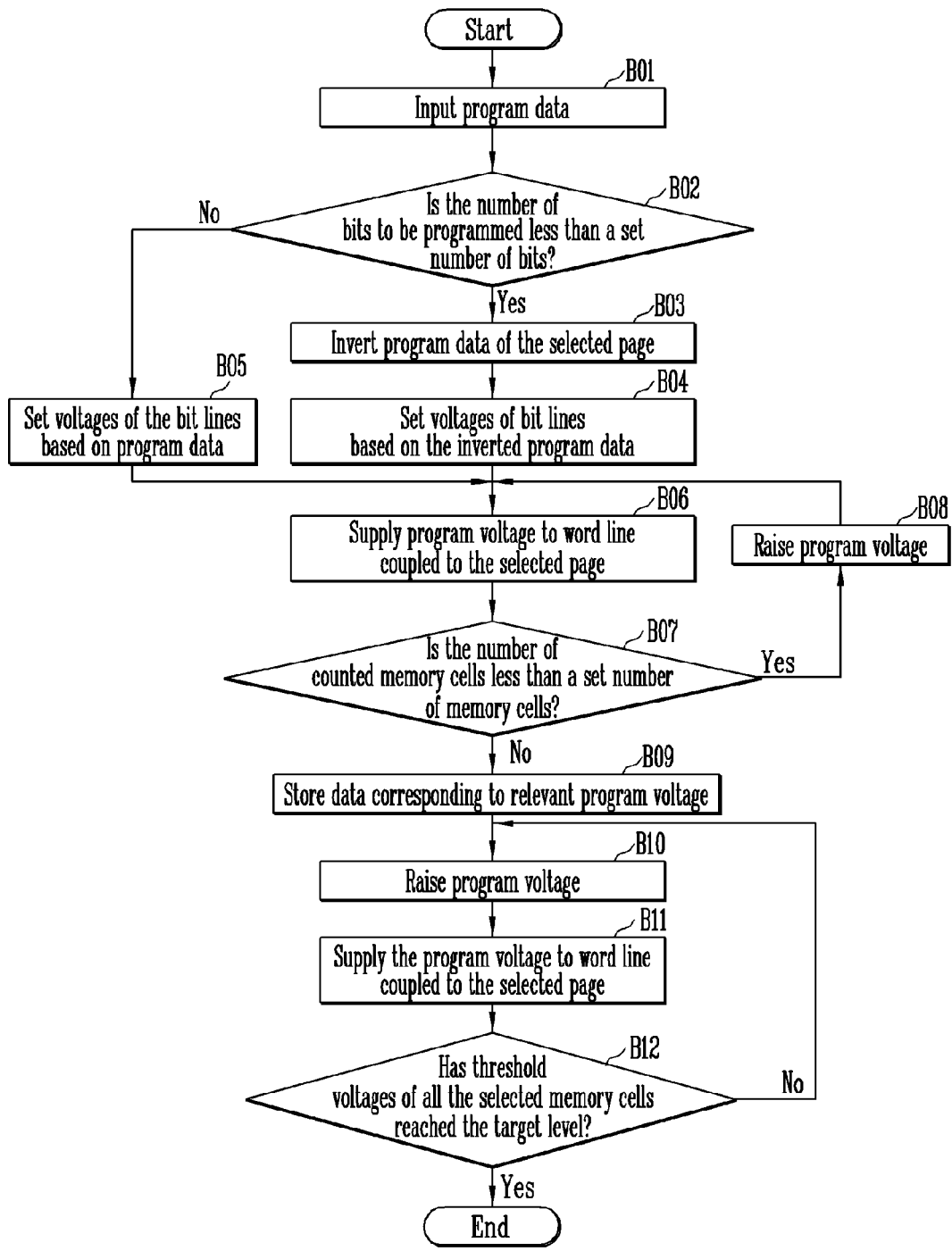
FIGS. 5 and 6 are flowcharts, in more detail, illustrating the program method of FIG. 4.
Figure 6:
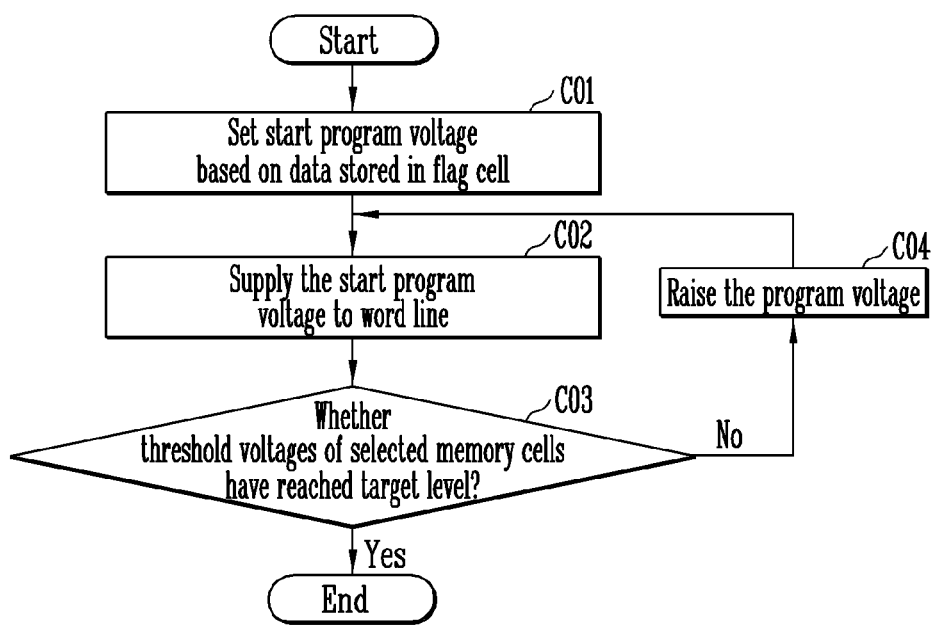

FIGS. 5 and 6 are flowcharts, in more detail, illustrating the program method of FIG. 4.

An LSB program operation for the even page is described below with reference to FIG. 5. When a program operation starts, LSB program data for the even page is inputted to the page buffers at step B01. It is then determined whether a number of bits to be programmed using the program data inputted to the page buffers is smaller than a set number of bits at step B02. For example, it is determined whether a number of "0" bit is smaller than a set number of bits. Here, the set number of bits is set to ½ or higher, e.g., 50% to 60% of a total number of bits of the selected page. This is because the number of bits for determining a program start voltage must be representative. For example, assuming that the total number of bits of the selected page is 100 and the number of bits to be programmed is 2, the number of bits to be programmed cannot represent the total number of bits.

If, as result of the determination at step B02, the number of bits to be programmed, e.g., the number of "0" bit is determined to be equal to or greater than the set number of bits, voltages of bit lines coupled to the respective page buffers are set based on the program data inputted to the page buffers at step A05. For example, when the program data is '0', the bit lines are discharged. When the program data is '1', the bit lines are precharged to a program-inhibition voltage.

If, as result of the determination at step B02, the number of bits to be programmed, e.g., the number of "0" bit is determined to be smaller than the set number of bits, the program data of the even page is inverted at step B03. More particularly, the program data inputted to the page buffers is inverted. That is, if data '0' has been inputted to the first latches of the page buffers, the data '0' is inverted to data '1'.

In particularly, when program data is inverted, relevant information is stored in a register or a memory cell, e.g., in the flag cell of a selected page, and the selected page is read using data stored in the flag cell when a read operation is performed. The voltages of the bit lines are set based on the inverted program data at step B04.

A program operation is performed by supplying a program voltage to a word line coupled to the even page at step B06. The program operation is performed according to the ISPP method of gradually raising the program voltage supplied to the word line. Accordingly, when the program operation is first performed at step B06, a start program voltage is supplied to the word line. Here, the start program voltage may be a preset start program voltage.

The number of memory cells having threshold voltages reached the target level is counted, and it is then determined whether the number of counted memory cells is smaller than a set number of memory cells at step B07. Here, the set number of memory cells may be differently set according to a memory device. For example, the set number of memory cells may be set to 5% or less of the total number of memory cells of the even page. Also, the set number of memory cells may be set to "1". If, as a result of the determination at step B07, the number of counted memory cells is determined to be smaller than the set number of memory cells, the program voltage is raised at step B08. The program operation (B06) is performed by supplying the raised program voltage to the word line, thereby raising the threshold voltages of the memory cells of the even page.

If, as a result of the determination at step B07, the number of counted memory cells is determined to be equal to or greater than the set number of memory cells, data corresponding to a relevant program voltage is stored in a register or a memory cell, e.g., in a flag cell at step B09. That is, data corresponding to the raised program voltage, which is supplied when the number of counted memory cells becomes equal to or greater than the set number of memory cells, is stored as a start program voltage data, for example, in the flag cell of the even page. Here, the flag cell may be programmed in various levels by assigning each start program voltage data to each threshold voltage level of the flag cell. The start program voltage data is used to set a start program voltage in a subsequent program operation. This is described later.

In order to perform the LSB program operation for the remaining memory cells of the even page, the program voltage is raised at step B10. The LSB program operation for the remaining memory cells of the even page is performed by supplying the raised program voltage to the selected word line at step B11. It is then determined whether the LSB program operation for the even page has been completed at step B12. If, as a result of the determination, the LSB program operation for the even page is determined not to have been completed, the LSB program operation for the remaining memory cells is repeatedly performed until threshold voltages of all the remaining memory cells reach the target level while gradually raising the program voltage (B10).

As described above, in a first program operation for a selected page (for example, the LSB program operation for the even page), the time that it takes to perform program operations does not decrease because a process of finding an optimal start program voltage has to be performed. However, the time that it takes to perform program operations may decrease by using the found optimal start program voltage in a next program operation in a relevant page.

Referring to FIG. 6, if a start program voltage data has been stored in a first program operation for a selected page as described with reference to FIG. 6, program operations are performed using the stored start program voltage data in an MSB program operation of the even page, and an LSB program operation and an MSB program operation for the odd page.

The MSB program operation for the even page is described below with reference to FIG. 6.

When a program operation starts, a start program voltage is set based on the start program voltage data stored in the flag cell in the LSB program operation for the even page at step C01. The set start program voltage is supplied to a word line coupled to the even page at step C02. Here, the set start program voltage is set to be higher than the start program voltage in the LSB program operation for the even page. Thus, in the MSB program operation for the even page, the threshold voltages of memory cells coupled to the even page may reach the target level rapidly. It is then determined whether the threshold voltages of the memory cells have reached the target level at step C03. If, as a result of the determination, the threshold voltage of any one of the memory cells is determined not to have reached the target level, the program voltage is raised at step C04. The steps C02, C03, and C04 are repeatedly performed until the threshold voltage of the relevant memory cell reaches the target level by supplying the raised program voltage to the word line.

The LSB program operation for the odd page is described below with reference to FIG. 6.

When a program operation starts, a start program voltage is set based on the start program voltage data stored in the flag cell in the LSB program operation for the even page at step C01. The set start program voltage is supplied to a word line coupled to the odd page at step C02. Here, since the even and the odd pages are coupled to the same word line, the program operation for the word line is the same as the program operation for the even page. The set start program voltage is set to be higher than the start program voltage of the LSB program operation for the even page. Thus, in the MSB program operation for the odd page, the threshold voltages of memory cells coupled to the odd page may reach the target level rapidly. It is then determined whether the threshold voltages of the memory cells have reached the target level at step C03. If, as a result of the determination, the threshold voltage of any one of the memory cells is determined not to have reached the target level, the program voltage is raised at step C04. The steps C02, C03, and C04 are repeatedly performed until the threshold voltage of the relevant memory cell reaches the target level by supplying the raised program voltage to the word line.

The MSB program operation for the odd page is described below with reference to FIG. 6.

When a program operation starts, a start program voltage is set based on the start program voltage data stored in the flag cell in the LSB program operation for the even page at step C01. The set start program voltage is supplied to a word line coupled to the odd page at step C02. Here, the set start program voltage is set to be higher than the start program voltage of the LSB program operation for the even page. Thus, in the MSB program operation for the odd page, the threshold voltages of memory cells coupled to the odd page may reach the target level rapidly. It is then determined whether the threshold voltages of the memory cells have reached the target level at step C03. If, as a result of the determination, the threshold voltage of any one of the memory cells is determined not to have reached the target level, the program voltage is raised at step C04. The steps C02, C03, and C04 are repeatedly performed until the threshold voltage of the relevant memory cell reaches the target level by supplying the raised program voltage to the word line.

According to the present disclosure, the time that it takes to perform program operations may decrease by setting an optimal start program voltage. Further, if the number of bits to be programmed, e.g., the number of "0" bit is smaller than the set number of bits, the program data of the selected page is inverted and the program operation is performed by the inverted data. Therefore, the start program voltage determined by the program operation may have an optimum value.

What is claimed is:

1. A method of operating a semiconductor memory device, the method comprising:
   performing an LSB program operation for selected memory cells while raising a program voltage;
   storing data, corresponding to a program voltage, in a first flag cell when a threshold voltage of a set number of memory cell among the selected memory cells reach a target level;
   performing the LSB program operation for some of the selected memory cells, having threshold voltages not reached the target level, until the threshold voltages of all the selected memory cells reach the target level; and
   performing an MSB program operation for the selected memory cells by using a program voltage, set based on the data stored in the first flag cell, as a start program voltage after the LSB program operation is completed.

2. The method of claim 1, wherein performing the LSB program operation for the selected memory cells comprises:
   supplying a program voltage to a word line coupled to the selected memory cells; and
   performing the LSB program operation while gradually raising the program voltage until a threshold voltage of any one of the selected memory cells reaches a target level.

3. The method of claim 1, wherein storing the data, corresponding to the relevant program voltage, in the first flag cell comprises storing data corresponding to a program voltage when a number of memory cells having threshold voltages reached the target level reach a set number.

4. The method of claim 3, wherein the set number is set to 1 or less than 5% of the selected memory cells.

5. The method of claim 4, wherein the first flag cell is programmed using an LSB program operation and an MSB program operation.

6. The method of claim 1, wherein the MSB program operation is performed by using the start program voltage set based on the data stored in the first flag cell or by using another start program voltage set to be 0.2 V to 0.5 V lower than the start program voltage set based on the data stored in the first flag cell.

7. The method of claim 1, further comprising, before performing the LSB program operation for the selected memory cells while raising the program voltage,
   inputting program data for the selected memory cells to page buffers, corresponding to the selected memory cells, and making a determination of whether a number of bits to be programmed is less than a set number of bits for each of the page buffers;
   if, as a result of the determination, the number of bits to be programmed is determined to be equal to or greater than the set number of bits, setting voltages of bit lines, corresponding to the respective page buffers, based on the program data; and
   if, as a result of the determination, the number of bits to be programmed is determined to be less than the set number of bits, inverting the program data stored in the page buffers and setting the voltages of the bit lines based on the inverted program data.

8. The method of claim 7, wherein after inverting the program data stored in the page buffers, information about the inverted program data is stored in a second flag cell of a selected page.

9. The method of claim 8, further comprising setting a program voltage to be used in a subsequent program operation based on the information stored in the second flag cell.

10. The method of claim 8, wherein a read operation is performed based on the information stored in the second flag cell.

11. The method of claim 1, further comprising making a determination of whether the LSB and MSB program operations for all pages to be programmed have been completed, after completing the MSB program operation for a page including the selected memory cells.

12. The method of claim 11, further comprising selecting a next page, if, as a result of the determination, the LSB and MSB program operations for all the pages to be programmed are determined not to have been completed, and setting a start program voltage for the MSB program operation by performing the LSB program operation for the selected next page.

13. A method of operating a semiconductor memory device, the method comprising:
   performing an LSB program operation for an even page of a first page, wherein first data, corresponding to a program voltage when threshold voltages of some of memory cells of the even page reach a target level, is stored in a flag cell;
   when the threshold voltages of all the memory cells of the even page reach the target level, performing remaining program operations for the first page using a start program voltage set based on the first data;
   after all the program operations for the first page are completed, selecting a second page;
   performing an LSB program operation for an even page of the second page, wherein second data, corresponding to a program voltage when threshold voltages of some of memory cells of the even page reach a target level, is stored in the flag cell; and
   when the threshold voltages of all the memory cells of the even page of the second page reach the target level, performing remaining program operations for the second page using a start program voltage set based on the second data.

14. The method of claim 13, wherein performing the remaining program operations for the first page comprises:
   performing an MSB program operation for the even page of the first page using the start program voltage set based on the first data;
   after the MSB program operation for the even page is completed, performing an LSB program operation for an odd page of the first page using the set start program voltage; and
   after the LSB program operation for the odd page is completed, performing the MSB program operation for the odd page using the set start program voltage.

15. The method of claim 13, wherein performing the LSB program operations for the even page of the first page comprises:
   inputting program data of the memory cells, included in the even page of the first page, to page buffers corresponding to the memory cells and making a determination of whether a number of bits to be programmed is less than a set number of bits for each page buffer;
   if, as a result of the determination, the number of bits to be programmed is determined to be equal to or greater than the set number of bits, setting voltages of bit lines, corresponding to the respective page buffers, based on the program data; and
   if, as a result of the determination, the number of bits to be programmed is determined to be less than the set number of bits, inverting the program data stored in the page buffers and setting the voltages of the bit lines based on the inverted program data.

16. A semiconductor memory device, comprising:
a memory cell array configured to store data;
page buffers coupled to the memory cell array through bit lines and configured to receive program data;
a fail bit counter configured to count the program data; and
a control circuit configured to compare a set number and a result of the count and control the page buffers so that when the number of program data is smaller than the set number, the program data stored in the page buffers is inverted and a program operation is performed based on the inverted data or when the number of program data is equal to or greater than the set number, the program data stored in the page buffers is maintained and a program operation is performed based on the maintained data.

17. The semiconductor memory device of claim 16, wherein the set number is set to half or more of a total number of bits of a selected page.

18. The semiconductor memory device of claim 16, the set number is set to 50% to 60% of a total number of bits of a page selected when the program operation is performed.

* * * * *